United States Patent
Li et al.

(10) Patent No.: US 7,564,688 B2
(45) Date of Patent: Jul. 21, 2009

(54) HEAT DISSIPATION ASSEMBLY

(75) Inventors: Min Li, Shenzhen (CN); Wu-Jiang Ma, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 56 days.

(21) Appl. No.: 11/940,948

(22) Filed: Nov. 15, 2007

(65) Prior Publication Data

US 2009/0059533 A1    Mar. 5, 2009

(30) Foreign Application Priority Data

Aug. 31, 2007   (CN) .................. 2007 1 0076764

(51) Int. Cl.
*H05K 7/20* (2006.01)
(52) U.S. Cl. .................. 361/704; 361/719; 257/718; 174/16.3; 165/80.3
(58) Field of Classification Search .................. None
See application file for complete search history.

(56) References Cited

U.S. PATENT DOCUMENTS

| | | | |
|---|---|---|---|
| 6,339,533 B1 | 1/2002 | Lee et al. | |
| 6,450,248 B1 * | 9/2002 | Chang | 165/80.3 |
| 6,542,367 B2 * | 4/2003 | Shia et al. | 361/703 |
| 6,822,864 B2 * | 11/2004 | Huang et al. | 361/697 |
| 6,978,827 B2 * | 12/2005 | Armstrong | 165/80.3 |
| 7,072,183 B2 * | 7/2006 | Lee et al. | 361/704 |
| 7,327,575 B2 * | 2/2008 | Yu et al. | 361/719 |

* cited by examiner

*Primary Examiner*—Boris L Chervinsky (57) ABSTRACT

A heat dissipation assembly for dissipating heat generated by an electronic component includes a heat sink contacting the electronic component, a pair of retaining members fixed on two lateral sides of a top portion of the heat sink, a pair of arms pivotably secured to the retaining members, and an operating member pivotably attached to the retaining members. The operating member has two cams for interacting with the retaining member and the heat sink. When the operating member is rotated from a vertical orientation to a horizontal orientation, the arms are driven by the operating member to rotate towards the heat sink to engage with barbs of a retention module. Furthermore, the arms are also activated to move upwardly so they can tightly engage with the barbs, thereby securing the heat sink to the electronic component.

16 Claims, 9 Drawing Sheets

HEAT DISSIPATION ASSEMBLY

BACKGROUND OF THE INVENTION

1. Field of the Invention

The present invention relates to a heat dissipation assembly, and more particularly to a heat dissipation assembly incorporating a locking device for securing a heat sink to a printed circuit board conveniently.

2. Description of Related Art

As computer technology continues to advance, electronic components such as central processing units (CPUs) of computers are made to provide faster operational speed and greater functional capabilities. When a CPU operates at a high speed in a computer enclosure, its temperature increases greatly and dramatically. It is desirable to dissipate the generated heat quickly, for example, by using a heat sink attached to the CPU in the enclosure. This allows the CPU and other electronic components in the enclosure to function within their normal operating temperature ranges, thereby assuring the quality of data management, storage and transfer. Generally, a locking device is required for mounting the heat sink to the CPU, thereby ensuring an intimate contact between the heat sink and the CPU.

U.S. Pat. No. 6,339,533 shows a heat dissipation assembly, which comprises a heat sink and a locking device. The heat sink comprises a base and a plurality of fins extending from the base. A pair of shoulders are formed at two lateral sides of the base, which are used for assembling the locking device to the heat sink. The locking device comprises a retention module and a pair of clips. Each clip has a pair of locking feet defining locking openings therein and slots adjacent to the locking openings. Four barbs are formed at four corners of the retention module. In assembly, the retention module is mounted on a printed circuit board. The heat sink is placed on the retention module and contacts with the electronic component. The clips are disposed on the shoulders of the heat sink in a manner such that the locking opening of one locking foot of each clip engages with a corresponding barb of the retention module. A tool is inserted into the slot of the other locking foot of the each clip to pivot the other locking foot, until the other locking opening engages with another corresponding barb of the retention module, thereby securing the heat sink to the electronic component.

However, in this patent, the fins cannot be provided at the pair of shoulders due to the spaces being occupied by the clips. This causes the amount of the fins to be limited, and a heat dissipation efficiency of the heat sink to be lowered, accordingly. Moreover, it is inconvenient in manipulating the tool to assemble the clips and the heat sink to the retention module.

What is needed, therefore, is a heat dissipating device which can overcome the above-mentioned disadvantages.

SUMMARY OF THE INVENTION

A heat dissipation assembly is disclosed for dissipating heat generated by an electronic component. The heat dissipation assembly includes a heat sink assembly contacting the electronic component, a pair of retaining members fixed on two lateral sides of a top portion of the heat sink assembly, a pair of arms pivotably secured to the retaining members respectively, and an operating member pivotably attached to the retaining members. The operating member has two cams interacting with the arm and the heat sink assembly, respectively. When the operating member is rotated from a vertical orientation to a horizontal orientation, the arms are driven by the operating member to rotate towards the heat sink assembly and engage with barbs of a retention module. Furthermore, the heat sink is depressed and the arms are moved upwardly by the operating member to have a secure engagement with the barbs, whereby the heat sink assembly has an intimate contact with the electronic component.

Other advantages and novel features of the present invention will become more apparent from the following detailed description when taken in conjunction with the accompanying drawings, in which:

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

Figure 1:
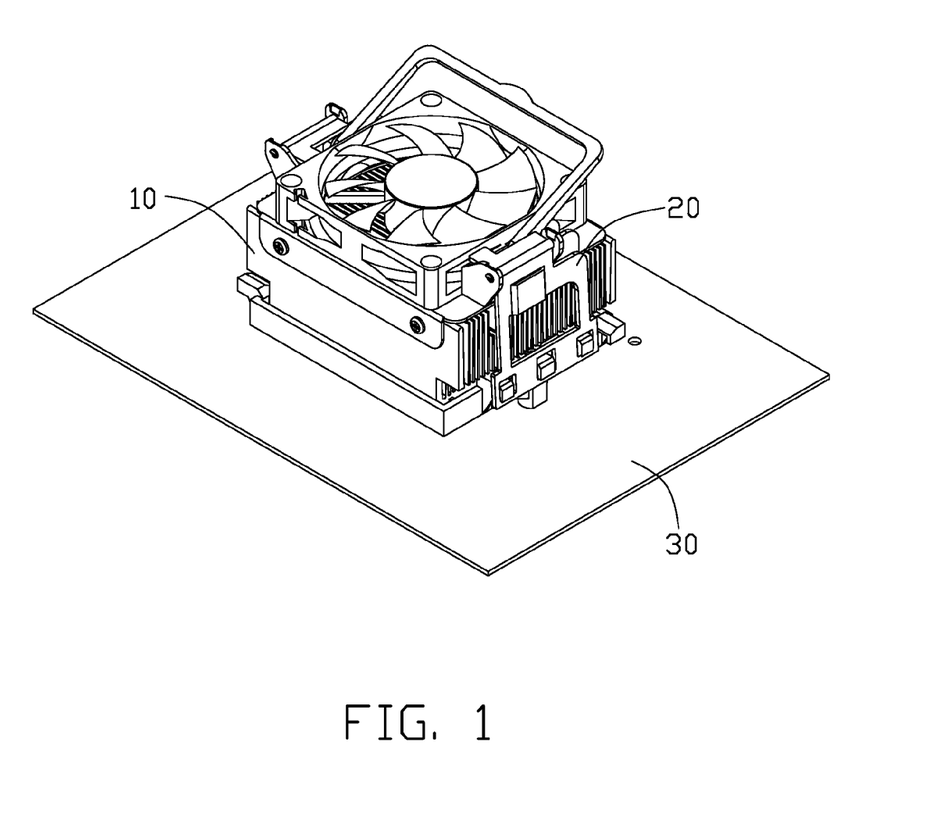
FIG. 1 is an assembled, isometric view of a heat dissipation assembly in according with a preferred embodiment of the present invention, with a printed circuit board having an electronic component mounted thereon.

Referring to FIG. 1, a heat dissipation assembly in accordance with a preferred embodiment of the present invention comprises a heat sink assembly 10 for dissipating heat generated by an electronic component (not shown) mounted on a printed circuit board 30, and a locking device 20 for securing the heat sink assembly 10 on the electronic component.

Figure 2:
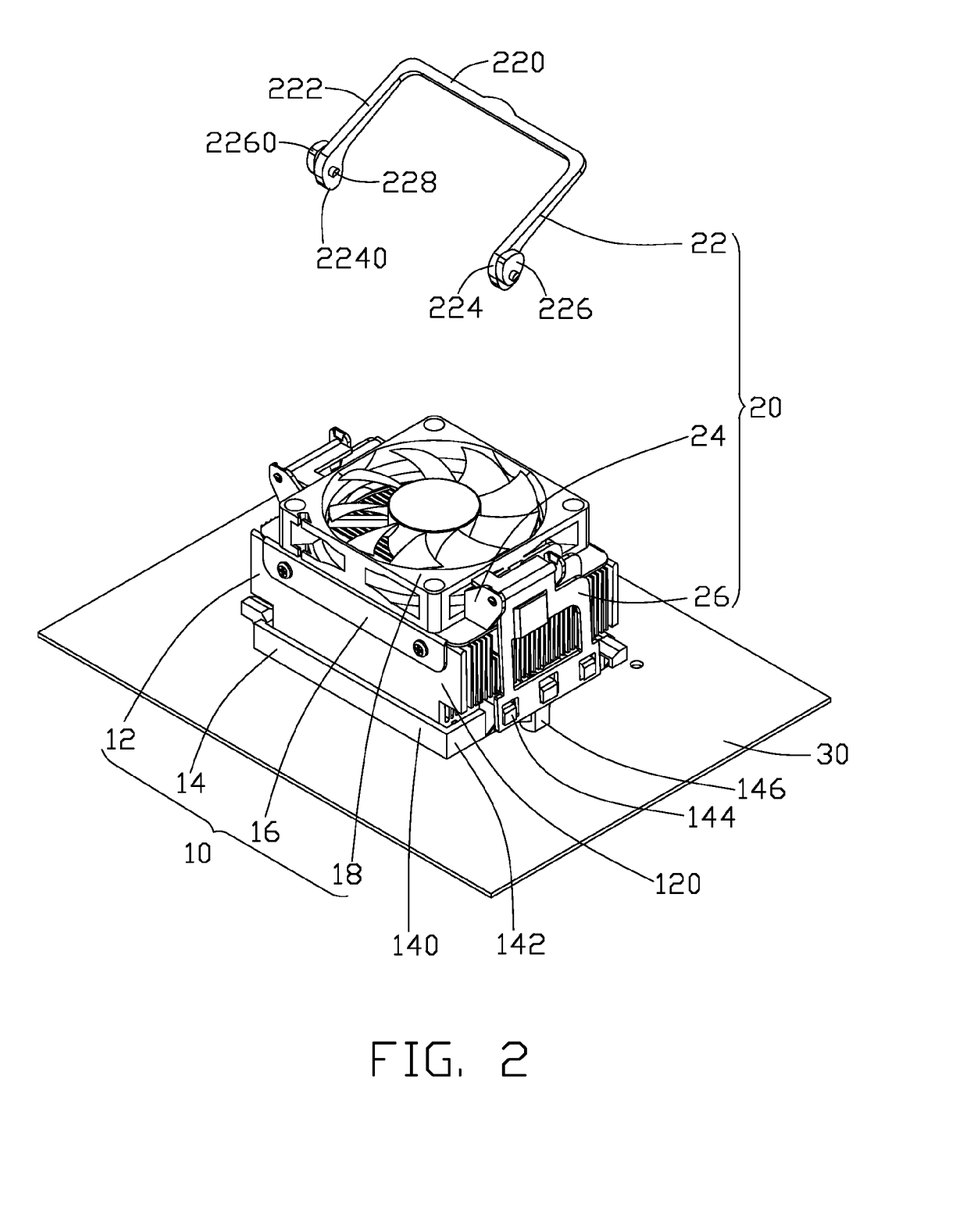
FIG. 2 is a view similar to FIG. 1, with an operating member of the heat dissipation assembly being separated therefrom.

As shown in FIG. 2, the heat sink assembly 10 comprises a heat sink 12, a retention module 14 enclosing the heat sink 12, a cover 16 covering the heat sink 12, and a fan 18 mounted on the cover 16. The heat sink 12 comprises a base (not shown) having a bottom face contacting the electronic component, and a plurality of fins 120 extending upwardly and perpendicularly from a top face of the base. The retention module 14 has a rectangular configuration, and comprises a pair of opposite walls 140 and another pair of opposite walls 142 interconnecting the pair of opposite walls 140, wherein the pair of opposite walls 140 and said another pair of opposite walls 142 contact outer faces of the base of the heat sink so that the retention module 14 receives the base therein. Three evenly spaced barbs 144 are formed outwardly from an outer face of each of said another pair of opposite walls 142. A pair of feet 146 (only one being shown) extend downwardly from a bottom face of the each of said another pair of opposite walls 142 through the printed circuit board 30, and engage with a back plate (not shown) underneath the printed circuit board 30 for securing the retention module 14 to the printed circuit board 30.

The cover 16 is attached on top portions of the fins 120 of the heat sink 12 by screws (not labeled). The cover 16 defines an opening (not labeled) at a central area thereof for providing a passage for an airflow to flow through the cover 16. The fan 18 is an axial fan and fixed on the cover 16 with its airflow outlet facing the fins 120 of the heat sink 12, whereby the airflow generated by the fan 18 can blow the fins 120 of the heat sink 12 through the opening of the cover 16 directly.

Figure 3:
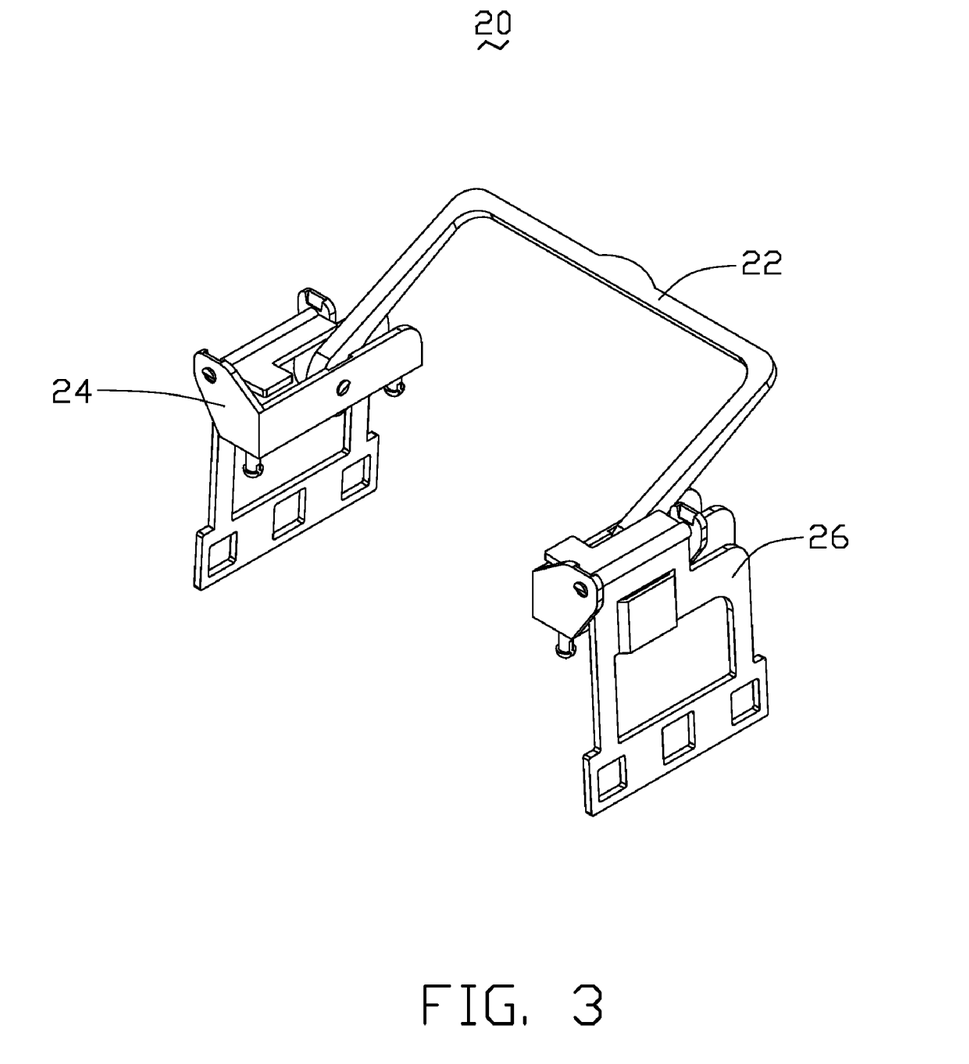
FIG. 3 is an enlarged, assembled view of a locking device of the heat dissipation assembly of FIG. 1.
Figure 4:
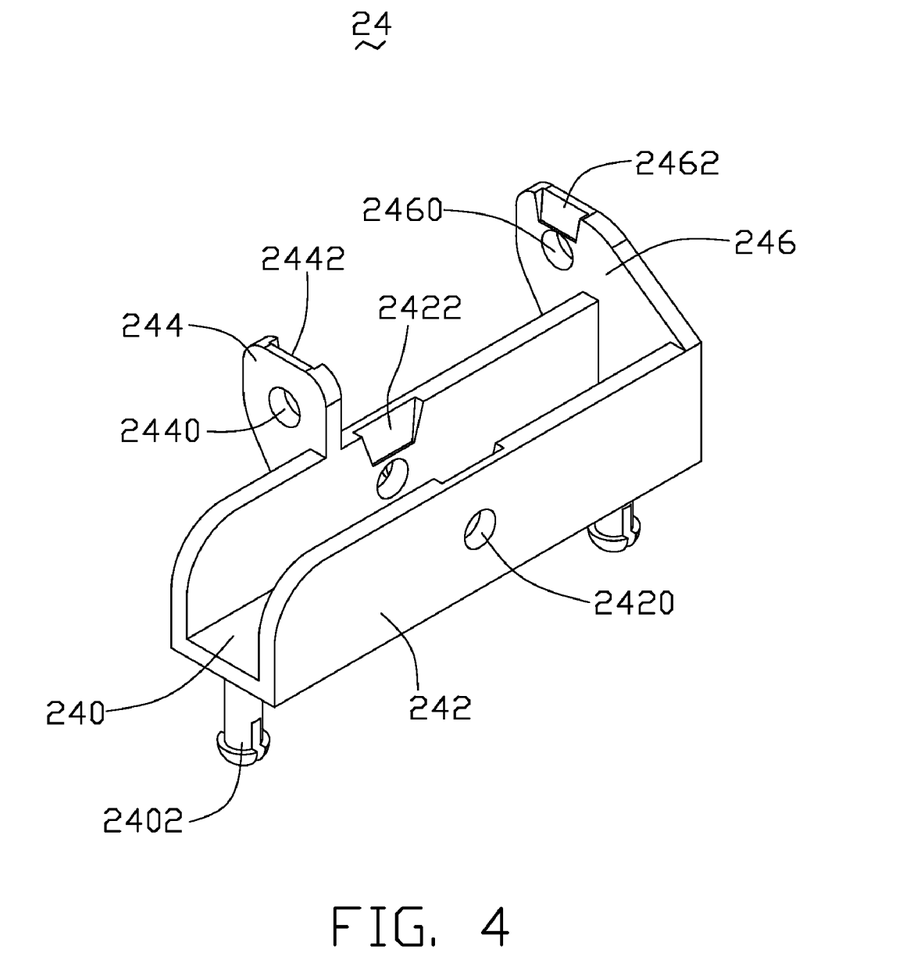
FIG. 4 is an enlarged view of a retaining member of the locking device of FIG. 3.
Figure 6:
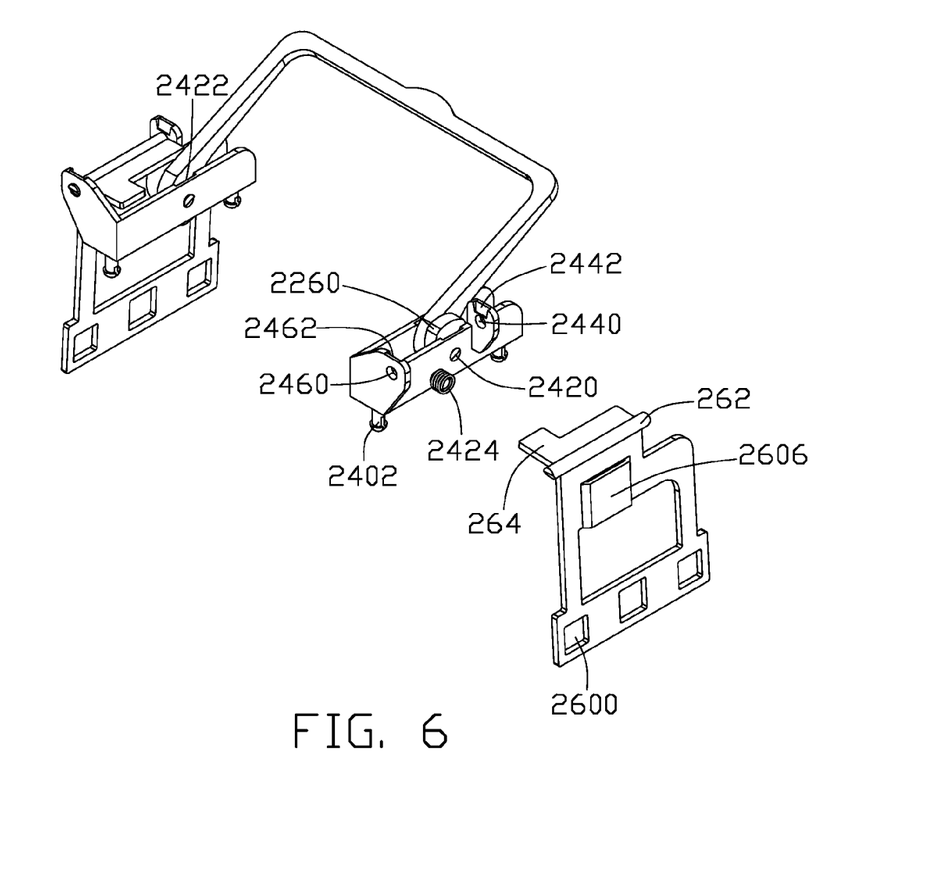
FIG. 6 is a view similar to FIG. 3 with the arm being separated from the locking device.

Also referring to FIG. 3, the locking device 20 fastens the heat sink assembly 10 on the printed circuit board 30. The locking device 20 comprises a pair of retaining members 24 mounted on the cover 16, a pair of arms 26 pivotably engaging with the pair of retaining members 24, and an operating member 22 pivotably secured to the retaining members 24. The operating member 22 is movable over the fan 18 from a vertical orientation which is a release position (FIG. 7) to a horizontal orientation which is a locked position (FIG. 9) and vice versa. Referring to FIG. 4, each of the retaining members 24 comprises a bottom plate 240 parallel to the base of the heat sink 12, a pair of lateral plates 242 extending upwardly and perpendicularly from two opposite sides of the bottom plate 240, a first tab 244 extending outwardly from an outer one of the pair of lateral plates 242, and a second tab 246 extending outwardly from an inner one of the pair of lateral plates 242. The bottom plate 240 has a rectangular shape with an opening (not shown) defined in a central area thereof. A pair of locking feet 2402 are formed downwardly from front and rear sides of a bottom face of the bottom plate 240, wherein each of the locking feet 2402 comprises a pole (not labeled) attached to the bottom plate 240, and a protrusion (not labeled) formed at a bottom end of the protrusion. A slot (not labeled) is defined through the protrusion and a bottom portion of the pole for providing a resilience to the protrusion. The protrusions of the pair of locking feet 2402 are used to extend downwardly through the cover 16, thereby mounting the retaining members 24 to the cover 16. The pair of lateral plates 242 are oriented parallel to each other and each has a rectangular configuration with a corner being arced. Each of the pair of lateral plates 242 defines a circular hole 2420 in a center thereof and a cutout 2422 at a top of a face thereof, located just above the circular hole 2420, wherein the circular holes 2420 of the pair of lateral plates 242 are in alignment with each other. A spring 2424 is attached on an outer face of the outer one the pair of lateral plates 242 at a position adjacent to the through hole 2420 and between the first tab 244 and the second tab 246 (shown in FIG. 6). The first tab 244 is located near the circular hole 2420 than the second tab 246. The first tab 244 has a top portion thereof extending upwardly beyond the outer one of the pair of lateral plates 242. A circular hole 2440 and a cutout 2442 are defined in the top portion of the first tab 244 with the cutout 2442 located above and adjacent to the circular hole 2440. The second tab 246 extends laterally and outwardly from an end of the inner one of the pair of lateral plates 242 beyond the outer one of the pair of lateral plates 242 and interconnect the pair of lateral plates 242. The second tab 246 reinforces the retaining member 24. An outer portion of the second tab 246 which extends outwardly beyond the outer one of the pair of lateral plates 242 has a circular hole 2460 and a cutout 2462 near the circular hole 2460. The cutout 2462 of the second tab 246 faces the cutout 2442 of the first tab 244, and the circular hole 2460 of the second tab 246 is in line with the circular hole 2440 of the first tab 244. A depth of each of the cutouts 2422, 2442, 2462 decreases gradually along a downward direction.

Referring to FIGS. 2-4, the operating member 22 comprises a handle (not labeled) that has a beam 220 and a pair of arms 222 extending downwardly from two opposite ends of the beam 220. A first cam 224 is formed slantwise at a distal end of each of the pair of arms 222. The first cam 224 has a profile of a portion of an ellipse with an extremity end 2240. A second cam 226 is formed on an outside of the first cam 224 with a periphery of the second cam 226 located within a periphery of the first cam 224, except an acute portion 2260 of the second cam 226 projecting beyond the periphery of the first cam 224. The acute portion 2260 has a curvature larger than that of other portions of the second cam 226, in other words the acute portion 2260 has a radian less than that of the other portions of the second cam 226. The acute portion 2260 has an orientation which forms an included angle of approximate 180 degrees with that of the extremity end 2240 of the first cam 224. In other words, the acute portion 2260 and the extremity end 2240 are opposite to each other. A pair of opposite posts 228 that are in alignment with each other for being received in the circular holes 2420 of the pair of lateral plates 242 of the retaining member 24, extend oppositely and horizontally from an inner face of the first cam 224 and an outer face of the second cam 226, respectively. An inner one of the pair of posts 228 is located at a center of the first cam 224, and an outer one of the pair of posts 228 is located away from the acute portion 2260 of the second cam 226. A distance from said outer one of the pair of posts 228 to the acute portion 2260 of the second cam 226 is longer than the distances from said outer one of the pair of posts 228 to the other portions of the second cam 226. A border portion (not labeled) is formed at a middle of the beam 220 for facilitating a gripping and an operation of the handle.

Figure 5:
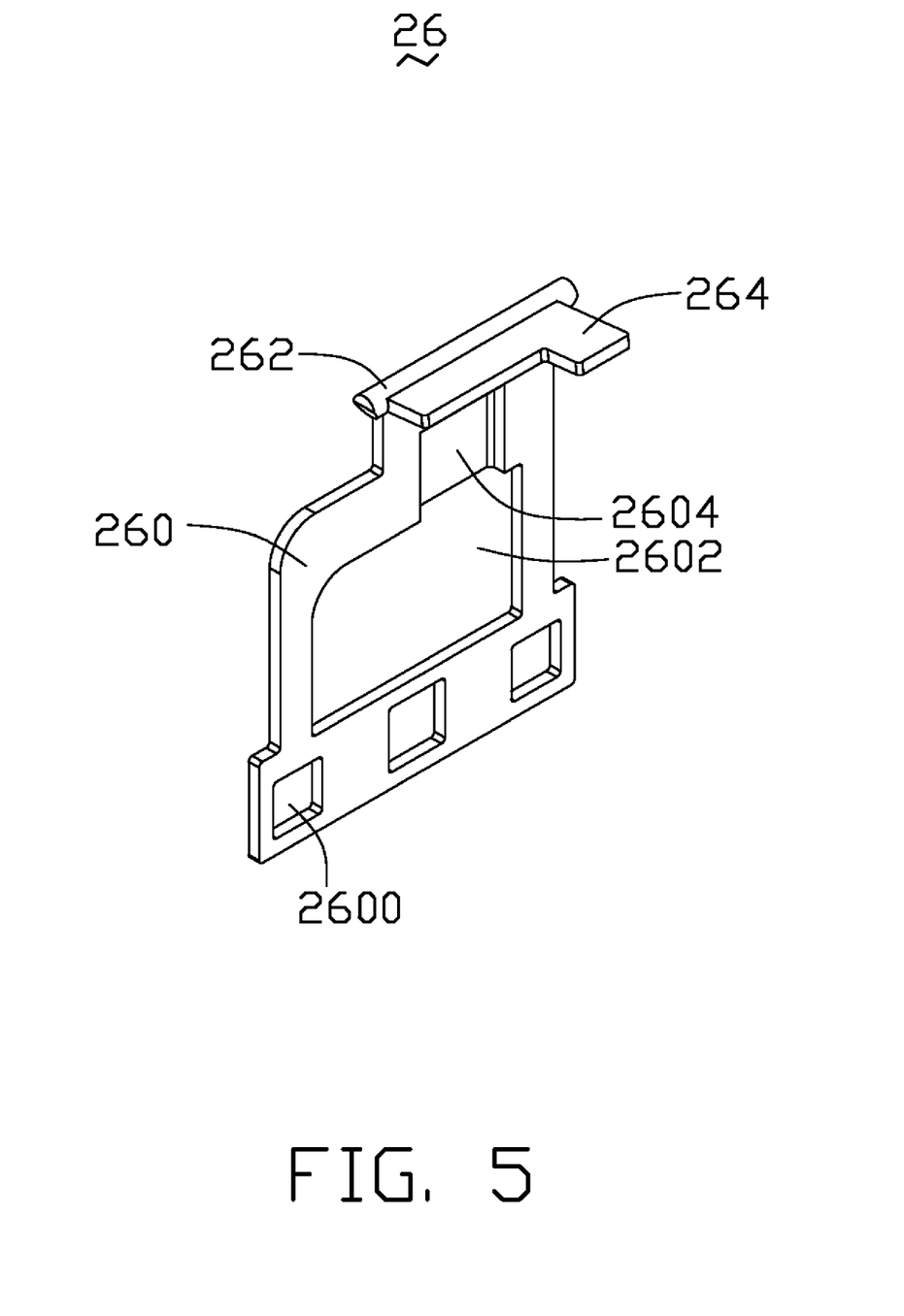
FIG. 5 is an enlarged view of an arm of the locking device of FIG. 3.

Illustrated in FIG. 5, each of the arms 26 comprises a wing 260, a shaft 262 attached on the wing 260, and an engaging tab 264 formed on the shaft 262. The wing 260 is a planar plate with widths of an upper portion (not labeled), a central portion (not labeled), and a lower portion (not labeled) increased in order. The lower portion defines three square holes 2600 therein, corresponding to the three barbs 144 of the retention module 14. An opening 2602 is defined in the central portion, whereby the airflow that has passed through the fins 120 of the heat sink 12 can flow out of the heat sink 12 without a block of the wing 260. A part of an inner face of the wing 260 is concaved outwardly to define a square trough 2604 communicating with the opening 2602 for receiving the spring 2424. A projection 2606, located corresponding to the trough 2604, projects outwardly with respective to an outer face of the wing 260 (shown in FIG. 6). The shaft 262 is formed horizontally at a top portion of the wing 260 with two opposite ends thereof extending beyond the top portion of the wing 260, for being engaged in the circular holes 2440, 2460 of the first tab 244 and the second tab 246 of the retaining member 24. The engaging tab 264 extending horizontally and inwardly from the shaft 262, and has an L-shaped configuration for confining the operating member 22 to have a single rotation relative to the retaining member 24.

Figure 7:
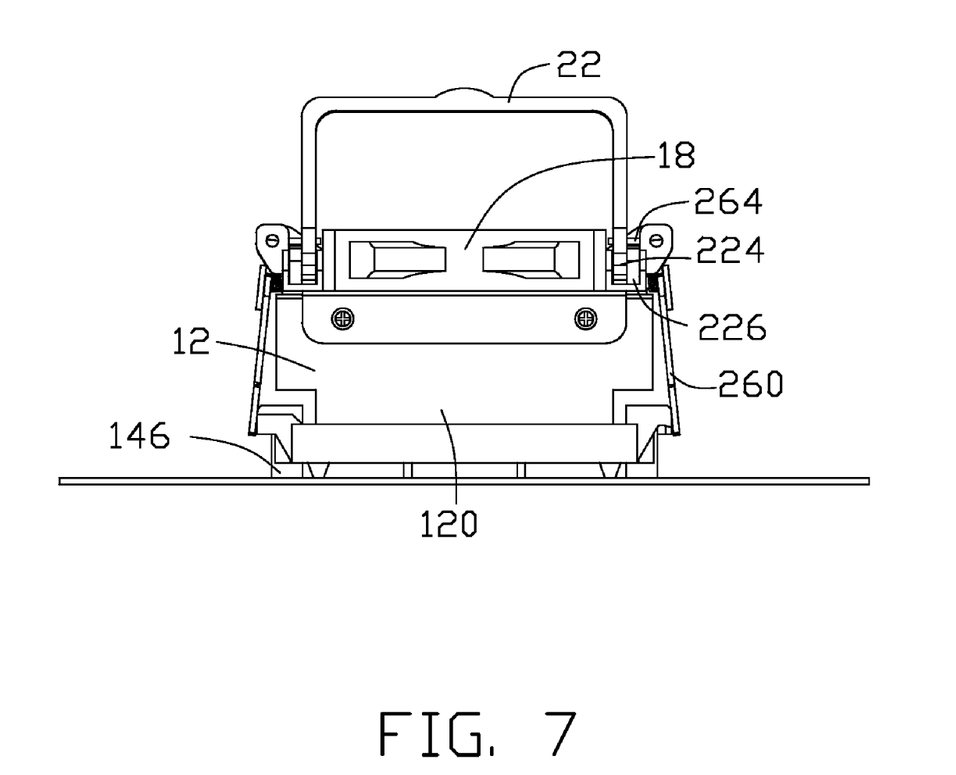
FIG. 7 is a side view of FIG. 1 with the locking device in a release position.

As shown in FIGS. 2-7, in assembly, the heat sink assembly 10 is disposed on the electronic component in a manner such that the base of the heat sink 12 contacts the electronic component. The feet 146 of the retention module 14 are brought to insert through the printed circuit board 30. The fan 18 is located over the electronic component for blowing the fins 120 of the heat sink 12. The pair of retaining members 24 are respectively fixed on the two lateral sides of the cover 16 with the pair of locking feet 2402 extending downwardly through the cover 16. The operating member 22 is brought to fit in the retaining members 24 along a vertical orientation by downwardly sliding the posts 228 of the operating member 22 interferingly along the cutouts 2422 of the pair of lateral plates 242 of the retaining members 24. The posts 228 continue to move until they are accommodated in the circular holes 2420 of the pair of lateral plates 242 of the retaining members 24. The first cams 224 are located just above the openings of the bottom plates 240 of the retaining members 24, respectively. In FIG. 7, when the arms 222 are vertically oriented, the extremity end 2240 of the first cam 224 and the acute portion 2260 of the second cam 226 point horizontally toward opposite directions, respectively. Then the shaft 262 of each of the pair of arms 26 is brought to slide interferingly and downwardly along the cutouts 2442, 2462 of first tab 244 and the second tab 246 of the each of the pair of retaining members 24 to reach the circular holes 2440, 2460 of the first tab 244 and the second tab 246 of the each of the pair of retaining members 24; thus, the shaft 262 is pivotably engaged in the circular holes 2440, 2460 of the first tab 244 and the second tab 246. The engaging tab 264 contacts a smooth portion (not shown) of the second cam 226 so as to cover the distal end of the operating member 22. Meanwhile, the spring 2424 of the retaining member 24 is compressed between an inner face of the trough 2604 of the arm 26 and the outer face of the outer lateral plate 242, such that the wing 260 of the arm 26 is pushed outwardly by the spring 2424 to define an acute angle with a lateral side of the heat sink 12, with the lower portion of the wing 260 positioned a distance from the barbs 144 of the retention module 14.

Figure 8:
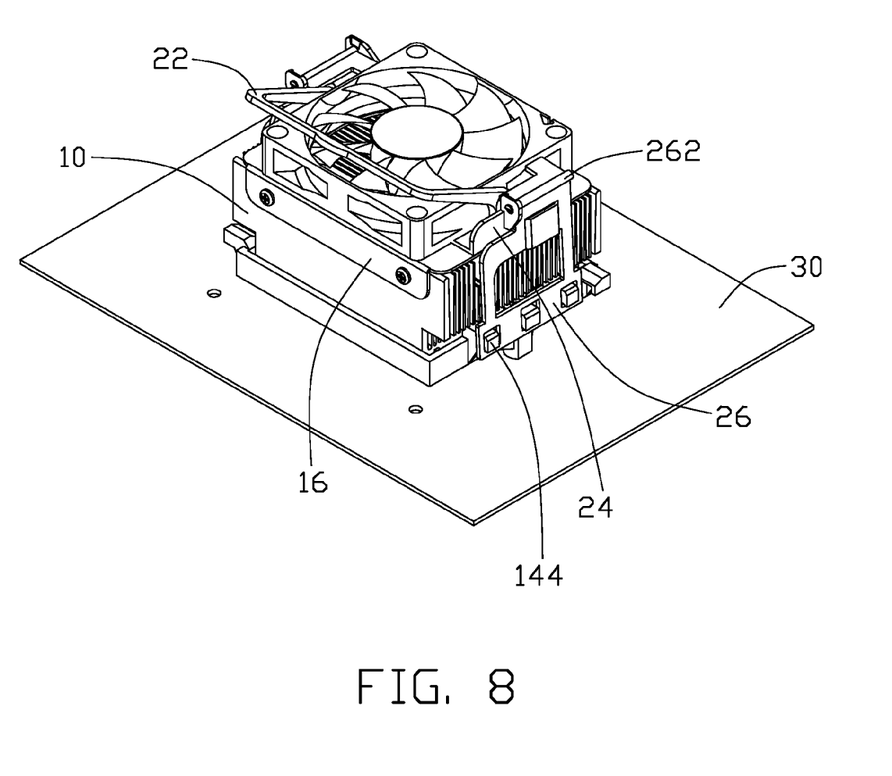
FIG. 8 is a view similar to FIG. 1, but from another aspect, with the locking device being moved from the release position of FIG. 7 toward a locked position.
Figure 9:
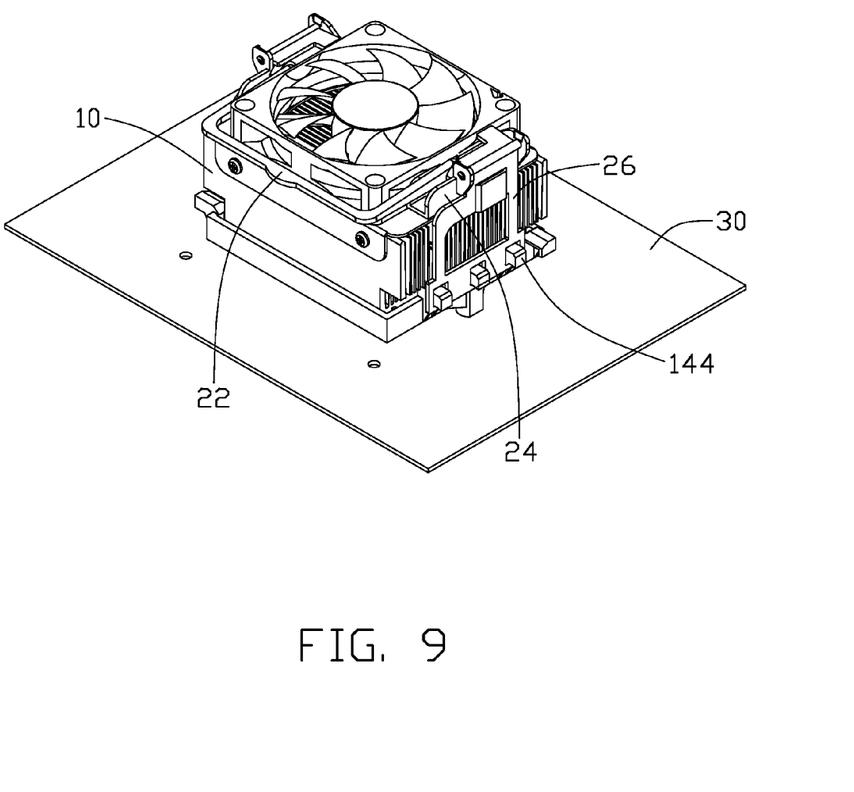
FIG. 9 is a view similar to FIG. 8 with the locking device in the locked position.

Also referring to FIGS. 8-9, in use, as the handle of the operating member 22 is rotated over the fan 18 around the posts 228 to move from the position of FIG. 7 to FIG. 9 via FIG. 8, the first cam 224 and the second cam 226 are rotated accordingly. Due to the distance from the smooth portion of the second cam 226 to the post 228 being less than the distance from the acute portion 2260 of the second cam 226 to the post 228 of the operating member 22, the rotation of the second cam 226 from the position of FIG. 7 to the position of FIG. 9 causes the acute portion 2260 of the second cam 226 to push upwardly against the engaging tab 264 of the arm 26, whereby the engaging tab 264 rotates upwardly about the shaft 262. The wing 260 of the arm 26 is activated by the engaging tab 264 to rotate downwardly and inwardly around the shaft 262 towards the retention module 14, and the spring 2424 is compressed by the projection 2606 of the arm 26, until the barbs 144 of the retention module 14 extend in the square holes 2600 of the arm 26 in FIG. 8. At the same time, the extremity end 2240 of the first cam 224 is rotated downwardly through the opening of the bottom plate 240 of the retaining member 24 to abut against a top face of the cover 16, and exerts a downward force on the cover 16 to press heat sink assembly 10 downwardly towards the electronic component. Simultaneously, the retaining member 24 with the arm 26 is raised until the protrusion of the locking foot 2402 abuts against the bottom face of the cover 16. When the handle is rotated to a horizontal orientation in FIG. 9, the barbs 144 of the retention module 14 tightly engage with the arm 26 and are locked into the square holes 2600 of the arm 26, and the acute portion 2260 of the second cam 226 and the extremity end 2240 of the first cam 224 are accordingly pivoted to respective vertical orientations. To release the secure attachment of the heat sink assembly 10 from the electronic component, the handle is rotated reversely until the arm 26 is pivoted to return to its original position of FIG. 7, with the spring 2424 returning to its original state pushing the arm 26 outwardly. Therefore, assembling and disassembling the heat sink assembly 10 to the electronic component is convenient and does not need using a tool. Furthermore, since the retaining members 24 are positioned on the top portions of the fins 120, they will not occupy the space for forming the fins 120, so that enough fins 120 can be formed on the base, and a high heat dissipation efficiency of the heat sink 12 is ensured.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation assembly adapted for dissipating heat generated by an electronic component mounted on a printed circuit board, the heat dissipation assembly comprising:
   a heat sink assembly for contacting the electronic component;
   a pair of retaining members fixed on two lateral sides of a top portion of the heat sink assembly;
   a pair of arms pivotably attached to the pair of retaining members, respectively; and
   an operating member pivotably secured to the pair of retaining members, wherein the operating member comprises a handle, a first cam formed slantwise at each of two distal ends of the handle, and a second cam formed outwardly from the first cam, wherein when the operating member is rotated from a vertical orientation to a horizontal orientation, the arms are activated by the operating member to rotate inwardly towards the heat sink assembly, and engage with the heat sink assembly, thus securing the heat dissipation assembly on the electronic component.

2. The heat dissipation assembly as claimed in claim 1, wherein a pair of posts extend oppositely from the first cam and the second cam respectively, the pair of posts being in line with each other.

3. The heat dissipation assembly as claimed in claim 2, wherein the first cam has an elliptical configuration with an inner one of the pair of posts located at a center thereof.

4. The heat dissipation assembly as claimed in claim 3, wherein the second cam is located within a periphery of the first cam except an acute portion thereof, an outer one of the pair of posts being located at an outer side of the second cam and away from the acute portion of the second cam, a distance between the acute portion and the outer one of the pair of posts being longer than that between the other portion of the second cam and the outer one of the pair of posts.

5. The heat dissipation assembly as claimed in claim 4, wherein when an extremity end of the first cam is located at the horizontal orientation, the acute portion of the second cam is also located at horizontal orientation and opposite to the extremity end.

6. The heat dissipation assembly as claimed in claim 4, wherein each of the pair of retaining members comprises a bottom plate secured on each of the two lateral sides of the top portion of the heat sink assembly, and a pair of lateral plates extending upwardly from two opposite sides of the bottom plate.

7. The heat dissipation assembly as claimed in claim 6, wherein a pair of through holes are defined in the pair of lateral plates and receive the posts of the operating member therein respectively, an opening being defined in the bottom plate beneath the first cam of the operating member.

8. The heat dissipation assembly as claimed in claim 7, wherein a first tab is formed outwardly from one of the pair of lateral plates, and a second tab is formed outwardly from a side of another one of the pair of lateral plates and connect the one of the pair of lateral plates.

9. The heat dissipation assembly as claimed in claim 8, wherein a spring is attached on an outer face of the one of the pair of lateral plates and abuts against the arm, a pair of circular holes being defined through the first tab and the second tab, respectively.

10. The heat dissipation assembly as claimed in claim 9, wherein each of the arms comprises a wing, a shaft fixed on a top portion of the wing, and an engaging tab extending inwardly from the shaft, the shaft being engaged in the circular holes of the first tab and the second tab of the retaining member.

11. The heat dissipation assembly as claimed in claim 10, wherein the wing abuts against the spring of the retaining member so as to be pushed by the spring, and is located slantwise at the one of two lateral sides of the heat sink assembly.

12. The heat dissipation assembly as claimed in claim 11, wherein a plurality of holes are defined in a lower portion of the wing for engaging with a bottom portion of the one of the two lateral sides of the heat sink assembly, and an opening is defined in a central portion of the wing above the three holes of the wing for allowing an airflow to pass through the wing.

13. The heat dissipation assembly as claimed in claim 11, wherein the engaging tab is located between the first tab and the second tab of the retaining member and contacts the second cam of the operating member for covering a corresponding one of the two distal ends of the operating member.

14. The heat dissipation assembly as claimed in claim 13, wherein the engaging tab is oriented perpendicular to the wing of the arm, the engaging tab having an L-shaped configuration for confining the operating member to rotate along a single orientation.

15. The heat dissipation assembly as claimed in claim 13, wherein when the handle of the operating member is rotated downwardly from the vertical orientation to the horizontal orientation around the pair of posts, the acute portion of the second cam is driven to rotate upwardly to the vertical orientation and push the engaging tab of the arm upwardly in a manner such that the wing is activated by the engaging tab to rotate downwardly around the shaft towards the bottom portion of the heat sink assembly and compress the spring of the retaining member, and simultaneously, the extremity end of the first cam is driven to rotate downwardly to a vertically downward orientation through the opening of the bottom plate and depress the top portion of the heat sink assembly to lift the retaining member and the arm, until the wing is locked with the bottom of the one of the lateral sides of the heat sink assembly.

16. A heat dissipation assembly comprising:
a retention module adapted to be mounted on a printed circuit board and surround an electronic component on the printed circuit board;
a heat sink having a base received in the retention module and a plurality of fins extending upwardly from the base;
a retaining member mounted on the fins of the heat sink;
an arm mounted to the retaining member and rotatable in respect thereto along a first direction, the arm having a bottom portion for engaging with barbs formed on the retention module; and
an operating member mounted to the retention member and rotatable in respect thereto along a second direction perpendicular to the first direction, the operating member having first and second cams formed thereon;
wherein when the operating member is moved from a release position to a locked position, the first cam of the operating arm activates the arm to move toward the heat sink and engage with the barbs of the retention module, and the second cam pushes downwardly on the heat sink and activates the arm to move upwardly to have a secure engagement with the barbs of the retention module.

* * * * *